US008462035B2

(12) United States Patent
Schimper et al.

(10) Patent No.: US 8,462,035 B2
(45) Date of Patent: Jun. 11, 2013

(54) DIGITAL-TO-ANALOG CONVERSION ARRANGEMENT WITH POWER RANGE DEPENDENT D/A CONVERTER SELECTION

(75) Inventors: Markus Schimper, Moosinnig (DE); Jose Moreira, Munich (DE)

(73) Assignee: Infineon Technologies AG, Neubiberg (DE)

( * ) Notice: Subject to any disclaimer, the term of this patent is extended or adjusted under 35 U.S.C. 154(b) by 54 days.

(21) Appl. No.: 13/106,992

(22) Filed: May 13, 2011

(65) Prior Publication Data
US 2012/0286984 A1 Nov. 15, 2012

(51) Int. Cl.
*H03M 1/66* (2006.01)
(52) U.S. Cl.
USPC .......................................................... 341/145
(58) Field of Classification Search
USPC ................................ 341/139, 144, 141, 145
See application file for complete search history.

(56) References Cited

U.S. PATENT DOCUMENTS

| | | | |
|---|---|---|---|
| 4,408,352 A | 10/1983 | Dudding | |
| 5,270,715 A * | 12/1993 | Kano | 341/139 |
| 5,635,936 A * | 6/1997 | Rybicki | 341/144 |
| 5,886,640 A * | 3/1999 | Wang et al. | 340/635 |
| 6,259,301 B1 | 7/2001 | Gailus et al. | |
| 6,822,595 B1 * | 11/2004 | Robinson | 341/144 |
| 7,035,595 B1 | 4/2006 | Kim et al. | |
| 2005/0258992 A1 | 11/2005 | Fontaine et al. | |
| 2009/0075601 A1 | 3/2009 | Nezhad-Ahmadi et al. | |
| 2009/0111414 A1 | 4/2009 | Sahota et al. | |
| 2010/0317300 A1 | 12/2010 | Behzad | |
| 2011/0085616 A1 | 4/2011 | Kuttner | |

FOREIGN PATENT DOCUMENTS

| | | |
|---|---|---|
| EP | 0966095 A1 | 12/1999 |
| WO | 2008133489 A1 | 11/2008 |
| WO | 2009036399 A1 | 3/2009 |
| WO | 2010068504 A2 | 6/2010 |

OTHER PUBLICATIONS

U.S. Appl. No. 13/106,963, filed May 13, 2011.
Office Action dated Nov. 15, 2012 for U.S. Appl. No. 13/106,963. 19 Pages.
Notice of Allowance dated Apr. 30, 2013 for U.S Appl. No. 13/106,963.

* cited by examiner

*Primary Examiner* — Brian Young
(74) *Attorney, Agent, or Firm* — Eschweiler & Associates, LLC

(57) ABSTRACT

A digital-to-analog conversion arrangement for converting a digital input signal comprises first and second digital-to-analog converters (DACs) having different signal resolutions and a digital-to-analog converter selector for selecting the first DAC or the second DAC if the digital input signal has a power in a first or a second power range, respectively. The digital-to-analog conversion arrangement further comprises an analog signal merger for merging a first analog signal and a second analog signal, the first analog signal being based on a first analog output signal of the first digital-to-analog converter and the second analog signal being based on a second analog output signal of the second analog-to-digital converter. A corresponding method for digital-to-analog conversion of a digital input signal and a computer readable digital storage medium are also described.

29 Claims, 13 Drawing Sheets

DIGITAL-TO-ANALOG CONVERSION ARRANGEMENT WITH POWER RANGE DEPENDENT D/A CONVERTER SELECTION

BACKGROUND

Some embodiments according to the invention are related to a digital-to-analog conversion arrangement. Some embodiments according to the invention are related to a method for digital-to-analog conversion of a digital input signal.

The field of wireless communications has seen a rapid evolution in the past, especially during the last two decades. During this evolution, a number of wireless communications standards were introduced, each new standard typically exploiting technological progress in order to offer superior performance. For example, the GSM (Global System for Mobile Communications), EDGE (Enhanced Data rates for GSM Evolution), and CDMA (Code Division Multiple Access) standards were and still are widely used by wireless communication networks and their subscribers. While early mobile stations such as cellular phones typically supported a single wireless communication standard only, subscribers were quick to demand more versatile mobile stations or devices which can be used with wireless networks operating under different wireless communications standards. Although the mobile device could comprise dedicated transceiver sections for the different communication standards, this typically leads to higher costs and increased space requirements. Therefore, multi-mode RF transceiver architectures are currently explored. Different standards like GSM/EDGE/UMTS define requirements to be fulfilled by a transceiver operating under the corresponding wireless communication standard.

Some transceiver architectures employ analog filters in a radio frequency (RF) domain in order to spectrally shape an outbound transmit signal or an inbound receive signal. Since the different wireless standards are assigned to different frequency ranges, a different filter would have to be used for each wireless standard. Since filters for the RF range are typically relatively expensive and bulky, transceiver designers attempt to find solutions that do not require an RF filter.

One component that can be found in transmitter architectures is a radio frequency digital-to-analog converter (RF-DAC), which is basically an up-converter combined with a digital-to-analog converter. When aiming at a multi-mode device for different standards like GSM/EDGE/UMTS, the RF-DAC needs to fulfill various requirements for error vector magnitude (EVM), TX-noise in the RX-band, and adjacent channel leakage rejection (ACLR). Some important RF-DAC requirements in an interstage filter-less polar transmitter are, for instance:

an output power gain control from −73 dBm up to 6 dBm (output power dynamic of 79 dB);

a local oscillator leakage requirement of −85 dBm for an output power of −67 dBm (see FIG. 1);

an output noise requirement of 160 dBc for output powers between −8 dBm up to 6 dBm, which is relaxed for lower output powers;

a third degree intermodulation (IM3) requirement of about −37 dB; and change of power level in a transmission slot.

RF-DAC topologies that fulfill the specification for a multi-mode polar-transmitter application without interstage-filters are currently the subject of research in the mobile communications industry. In these filter-less RF-DAC topologies, the only available filtering between a low noise amplifier (LNA) of a transmitter receive path (RX) and an output port of the power amplifier in the transmit (TX) path is typically the duplexer attenuation. Especially filter-less DAC-mixer topologies, which fulfill an output noise requirement of 160 dBc as defined above for an offset-frequency of 20 MHZ up to 450 MHZ, have been and are still investigated. Other requirements to be fulfilled are the above mentioned LO-leakage and IM3 specification. At least some of these specifications may be partially contradicting each other and may lead to a conflict.

SUMMARY

Some embodiments according to the teachings disclosed herein provide a digital-to-analog conversion arrangement for converting a digital input signal into a corresponding analog output signal.

A digital-to-analog conversion arrangement according to an embodiment of the teachings disclosed herein may comprise a first digital-to-analog converter having a first signal resolution and a second digital-to-analog converter having a second signal resolution. The second signal resolution typically is different from the first signal resolution. The digital-to-analog conversion arrangement may further comprise a digital-to-analog converter selector configured to select the first digital-to-analog converter for digital-to-analog conversion of the digital input signal if the digital input signal has a power in a first power range. Likewise, the digital-to-analog converter selector is configured for selecting the second digital-to-analog converter for digital-to-analog conversion of the digital input signal if the digital input signal has a power in a second power range. The digital-to-analog conversion arrangement is configured to merge a first analog signal and a second analog signal, the first analog signal being based on a first analog output signal of the first digital-to-analog converter and the second analog signal being based on a second analog output signal of the second digital-to-analog converter.

In another embodiment according to the disclosed teachings a digital-to-analog conversion arrangement for converting a digital input signal may comprise a first digital-to-analog converter, a second digital-to-analog converter, a power determinator, a comparator, and an analog signal merger. The first digital-to-analog converter may be configured for converting a first subset of bits of a digital input signal, while the second digital-to-analog converter may be configured for converting a second subset of the bits of the digital input signal. The second subset may be at least partially overlapping with the first subset.

The power determinator may be configured to determine a digital input signal power of the digital input signal. The comparator may be configured for comparing the digital input signal power with a threshold and for generating a comparison result with a value depending on whether the digital input signal is above or below the threshold. The digital-to-analog conversion arrangement may be configured to merge a first analog signal and a second analog signal, the first analog signal being based on a first analog output signal of the first digital-to-analog converter, and the second analog signal being based on a second analog output signal of the second digital-to-analog converter, The comparison result may activate the first digital-to-analog converter if the digital input signal is below the threshold. On the other hand, the comparison result may activate the second digital-to-analog converter if the digital input signal is above the threshold.

Another embodiment according to the teachings disclosed herein provides a digital-to-analog conversion arrangement for converting a digital input signal, the digital-to-analog conversion arrangement comprising a first means for converting the digital input signal to an analog signal using a first subset of bits of the digital input signal, a second means for converting the second digital input signal to an analog signal using a second subset of bits of the digital input signal, a means for selecting the first means for converting if the digital input signal has a power in a first power range, and for selecting the second means for converting if the digital input signal has a power in a second power range, and a means for merging a first analog signal and a second analog signal, the first analog signal being based on a first analog output signal of the first means for converting and the second analog signal being based on a second analog output signal of the second means for converting.

According to a further embodiment, a method for digital-to-analog conversion of a digital input signal comprises: determining in which of a plurality of power ranges the digital input signal currently is; selecting one digital-to-analog converter from a plurality of digital-to-analog converters in dependence on the determined power range; converting the digital input signal to a first analog output signal using the selected one of the plurality of digital-to-analog converters; and merging a first analog signal with at least one further analog signal, the first analog signal being based on the first analog output signal of the selected one of the plurality of digital-to-analog converters and the at least one further analog signal being based on at least one further analog output signal of at least one further digital-to-analog converter of the plurality of digital-to-analog converters.

According to a further embodiment, a computer readable digital storage medium has stored thereon a computer program having a program code for performing, when running on a computer, a method for digital-to-analog conversion of a digital input signal, the method comprising: determining in which of a plurality of power ranges the digital input signal currently is; selecting one digital-to-analog converter from a plurality of digital-to-analog converters in dependence on the determined power range; converting the digital input signal to a first analog output signal using the selected digital-to-analog converter; and merging a first analog signal with at least one further analog signal, the first analog signal being based on the first analog output signal of the selected digital-to-analog converter and the at least one further analog signal being based on at least one further analog output signal of at least one further digital-to-analog converter of the plurality of digital-to-analog converters.

BRIEF DESCRIPTION OF THE DRAWINGS

Embodiments according to the teachings disclosed herein will subsequently be described with reference to the enclosed figures, in which.

DETAILED DESCRIPTION

Figure 1:
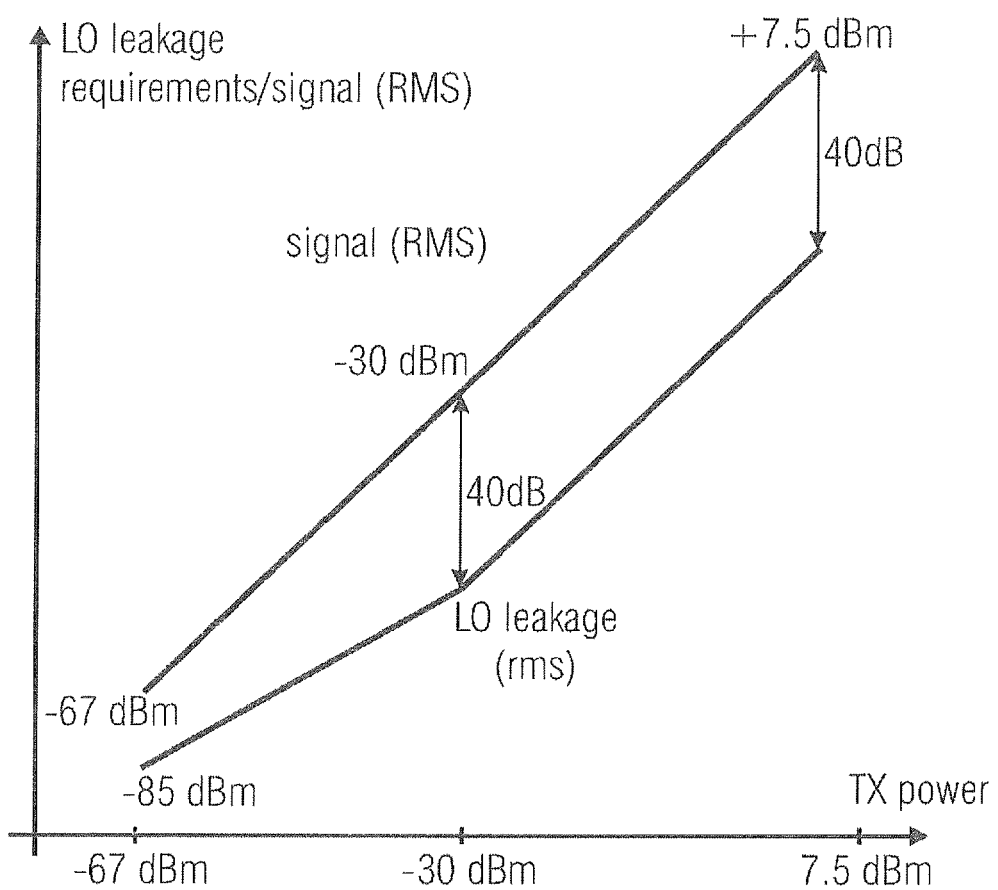
FIG. 1 shows a plot illustrating a possible local oscillator leakage requirement over transmitted output power according to an industry standard.

FIG. 1 shows a plot of the LO-leakage requirement over transmitted output power. In order to better illustrate the level difference between the signal and the LO-leakage, both being measured as root-mean-square (RMS) of the corresponding signals, the transmit power is depicted in FIG. 1, too (upper, straight line). The lower curve represents the LO-leakage power. It can be seen that for a relatively low output power of the signal of −67 dBm the level of the local oscillator leakage must not exceed −85 dBm, i.e. a level difference of 18 dB needs to be maintained between the LO-leakage signal and a payload signal. Between −76 dBm and −30 dBm of transmit power, the minimum allowable difference between the LO-leakage and the signal increases and reaches 40 dB for a transmit power of −30 dBm. For higher transmit powers between −30 dBm and +7.5 dBm, the minimal allowable difference of 40 dB remains constant. In other words, the local oscillator leakage has to be weaker than the transmitter power by at least 40 dB in this power range of the transmit signal.

Figure 2:
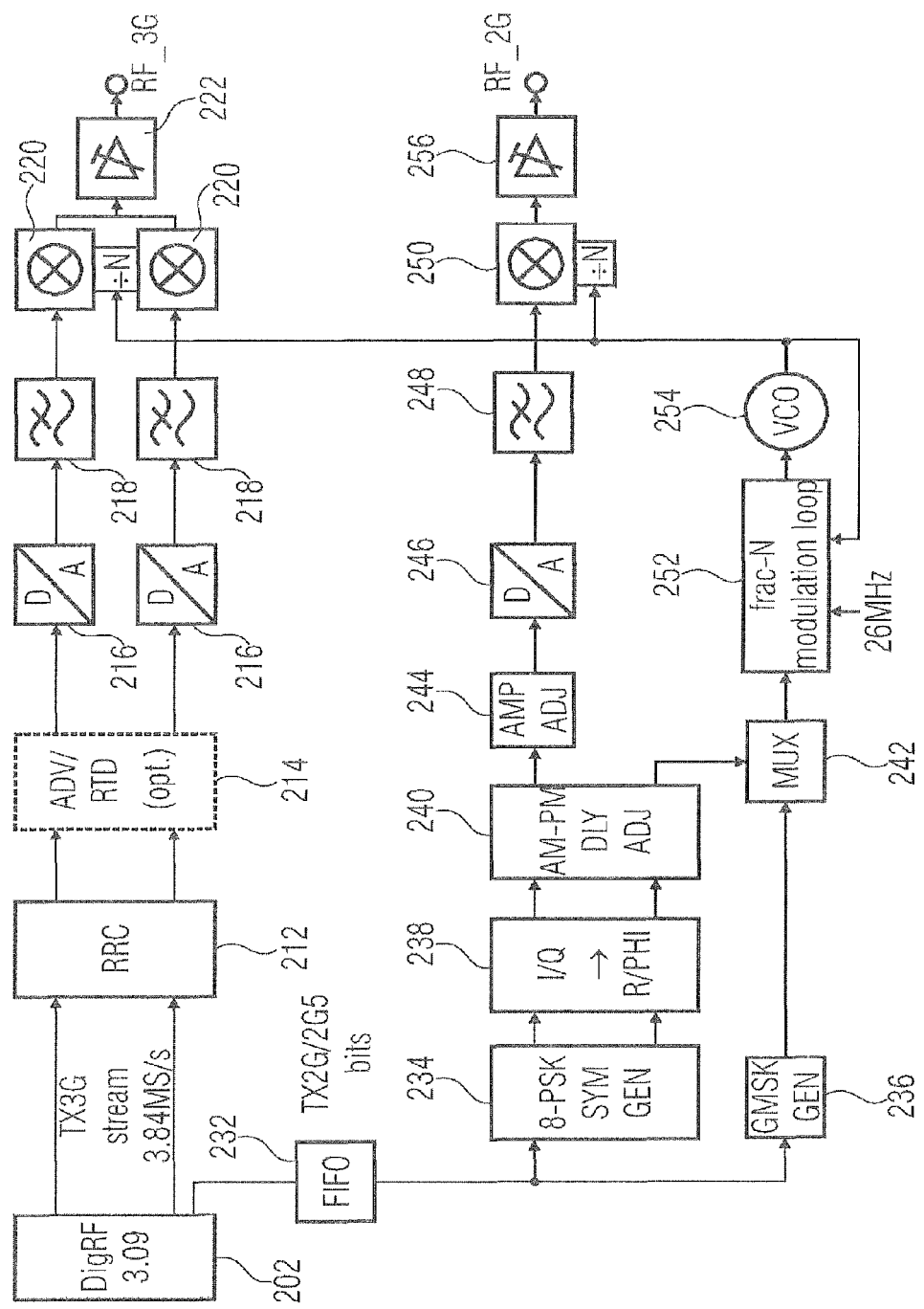
FIG. 2 shows a transmit path architecture having different transmit paths for 2G and 3G wireless communications standards.

FIG. 2 shows a schematic block diagram of a multi-mode transmitter not according to the teachings disclosed herein. The transmitter of FIG. 2 comprises a 2G/2.5G polar modulator and a 3G vector modulator. The 3G vector modulator is for a reasonable current consumption weak in noise and spur performance, therefore an additional interstage-SAW between TX-out and PA has to be placed. The 3G vector modulator is located in an upper half of FIG. 2, while the 2G/2.5G polar modulator is in a lower half of FIG. 2.

The 3G vector modulator is connected to an interface 202 according to the DigRF specification. The interface 202 provides a datastream to the 3G vector modulator, the datastream being labeled "TX3G STREAM 3.84MS/s" in FIG. 2. A radio resource control (RRC) module 212 receives the data stream. The radio resource control belongs to the UMTS WCDMA protocol stack and handles the control plane signaling of layer 3 between the user equipment and the UMTS terrestrial radio axis network (UTRAN). The abbreviation UMTS stands for "Universal Mobile Telecommunications System". The abbreviation WCDMA stands for "Wideband Code Division Multiple Access".

An optional advance/retard generator 214 adjusts the data stream with respect to a clock reference. Note that the datastream provided by the DigRF interface 202 comprises two components, namely an in-phase component I and a quadrature component Q. The in-phase component and the quadrature component are sent to individual digital-to-analog converters 216 which are connected at their respective outputs to low-pass filters 218. The low-pass filtered, analog in-phase and quadrature components are then provided to two mixers 220 in order to perform a frequency up-conversion. The up-converted in-phase and quadrature components are then combined prior to being fed to a variable power amplifier 222. A 3G transmit signal labeled "RF_3G" that can be used to feed an antenna is provided at an output of the power amplifier 222.

The 2G/2.5G polar modulator shown in the lower half of FIG. 2 is connected to the DigRF interface 202, too. A datastream labeled "TX2G/2G5 BITS" comprising transmit bits is provided to a first-in-first-out (FIFO) buffer 232. The datastream is fed to an 8-phase shift keying symbol generator ("8-PSK SYM GEN") 234. Furthermore, the datastream is also provided to a Gaussian minimum shift keying generator ("GMSK GEN") 236. Referring back the 8-PSK symbol generator 234, an in-phase component and a quadrature component of the datastream are provided at respective outputs of the 8-PSK symbol generator 234. A vector-to-polar converter 238 converts the in-phase component and the quadrature component into an amplitude/phase representation. A delayed adjustment unit 240 for adjusting a delay between the amplitude modulation and the phase modulation parts is connected to an output side of the vector-to-polar converter 238. The amplitude part is provided to an amplitude adjusting unit 244 and then digital-to-analog converted by means of a digital-to-analog converter 246. The analog amplitude signal is low-pass filtered by a low-pass filter 248 and then fed to a mixer 250.

A phase processing path of the 2G/2.5G polar modulator begins at the Gaussian minimum shift keying generator 236, an output signal of which is provided to a multiplexer 242. As another input, the multiplexer 242 also receives the phase modulation part as produced by the delay adjustment unit 240. The multiplexer 242 forwards one of its two inputs to a frac-N modulation loop 252 which also receives a 26 MHz clock reference signal. A third input to the frac-N modulation loop 252 is provided by an output of a voltage controlled oscillator 254. In combination, the frac-N modulation loop and the voltage controlled oscillator (VCO) form a frequency multiplier, the output of which is provided to the mixers 220 and 250. An output of the mixer 250 is connected to an adjustable power amplifier 256 and an output signal of the adjustable power amplifier 256 is suitable to be fed to an antenna as a 2G/2.5G transmit signal.

The 3G vector modulator is for a reasonable current consumption weak in noise and spur performance, therefore an additional interstage surface acoustic wave (SAW) between the mixers 220 and the power amplifier 222 has to be placed.

Figure 3:
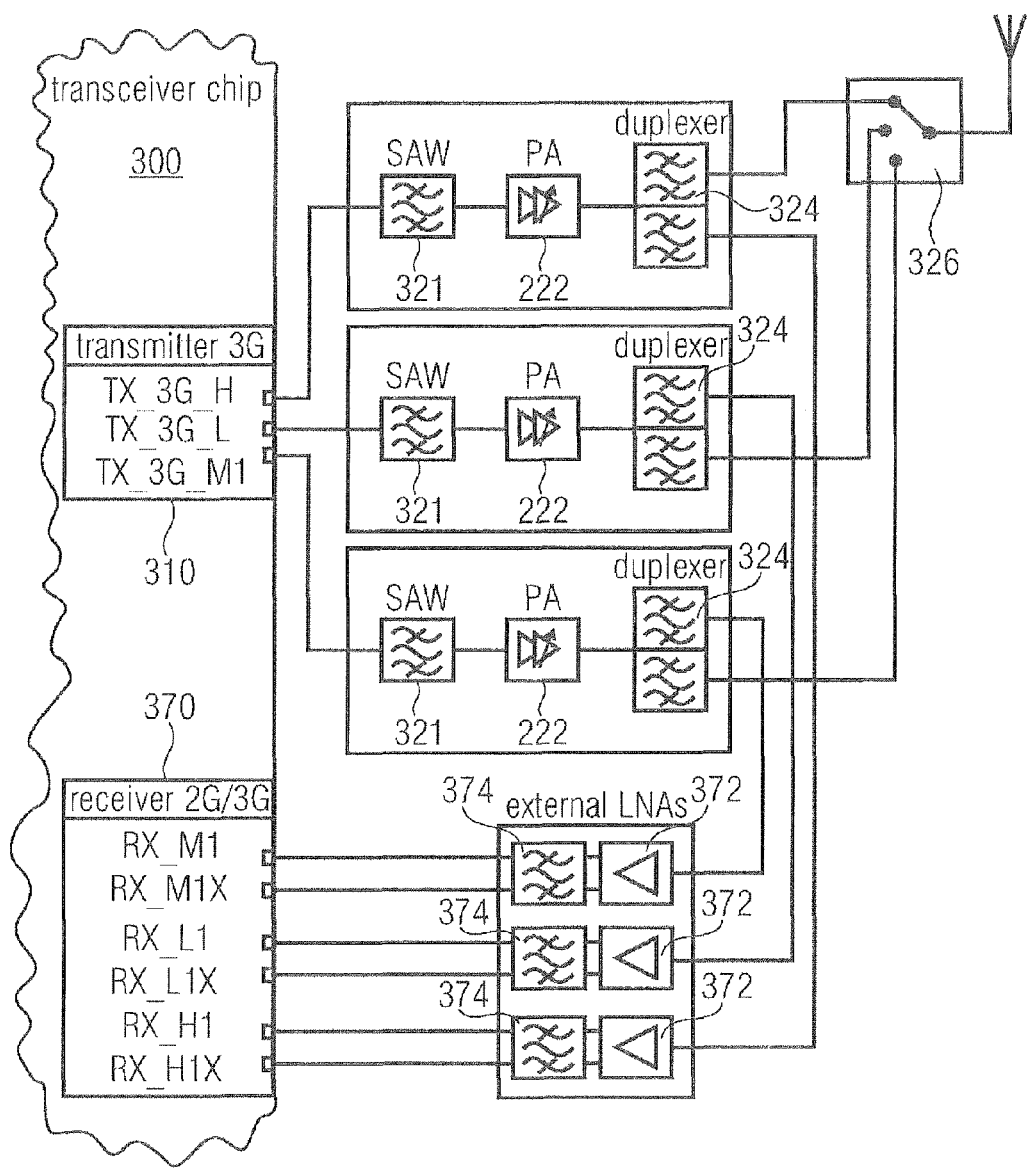
FIG. 3 shows a schematic block diagram of a transceiver employing surface acoustic wave (SAW), duplexers and external low noise amplifiers (LNA)

As mentioned above, some architectures of a 3G vector modulator not covered by the novel teachings of this disclosure require additional interstage surface acoustic wave filters or equivalent filter elements. In FIG. 3, a transceiver chip 300 on which the transmitter 310 and a corresponding receiver 370 are implemented, is depicted with external surface acoustic wave interstage filters 321 in front of the power amplifiers 222. Furthermore, external low noise amplifiers (LNA) are provided at an input side of the receiver 370. Duplex filters 334 are provided in order to separate the transmit band from the receive band in the frequency domain.

The transceiver architecture shown in FIG. 3 actually comprises three transmit paths and three receive paths which are assigned to a low frequency range (labeled "L", "L1", "L1X") to a medium frequency range (labeled "M1", "M1X"), and to a high frequency range (labeled "H", "H1", "H1X"). Each transmit path comprises a surface acoustic wave filter 321, an individual power amplifier 222 and an individual duplexer 224. Each one of the receive paths comprises a low noise amplifier 372 and a bandpass filter 374 corresponding to the selected frequency band. Both the transmitter 310 and the receiver 370 comprise corresponding ports for the three different frequency bands and the corresponding transmit/receive hardware. Furthermore, a selector switch 326 is provided between the duplexers 324 and the antenna so that a currently selected frequency band can be transmitted and received via the antenna and the transceiver chip 300.

The transmit architecture shown in FIG. 3 is typically not multi-mode capable and it requires surface acoustic wave interstage filters. Furthermore, the architecture shown in FIG. 3 would be difficult to implement in connection with a single-chain power amplifier.

In order to reach an allowable TX-noise level in the receive band according to common specifications, a 14-bit single-ended current steering digital-to-analog converter may be required (or a digital-to-analog converter having an even higher resolution). A typical 14-bit DAC may comprise a 10-bit thermometer coded part and a 4-bit segmented part. It would be desirable to achieve, with a single-ended DAC and a stacked mixer, a level of −160 dBc/Hz noise at 20 MHz at 6 dBm output power, without a filter between the DAC and the mixer. High linearity is difficult or even nearly impossible to achieve over the whole output-power range, because the parasitic DAC capacitance is constant and for small output powers the current density in the mixer gets so low that the IM3 performance degrades. In order to overcome the constant DAC capacitance and low current density in the mixer, the idea according to the teachings disclosed herein is to separate the power range in different output power sub-ranges. For each range the mixer is sized to achieve optimal IM3 performance. The DAC capacitance below the mixer is reduced by using DACs with lower bit numbers for small output power ranges. Sizing the mixer small may be necessary for LO-leakage requirements as depicted in FIG. 1, as well.

Figure 4:
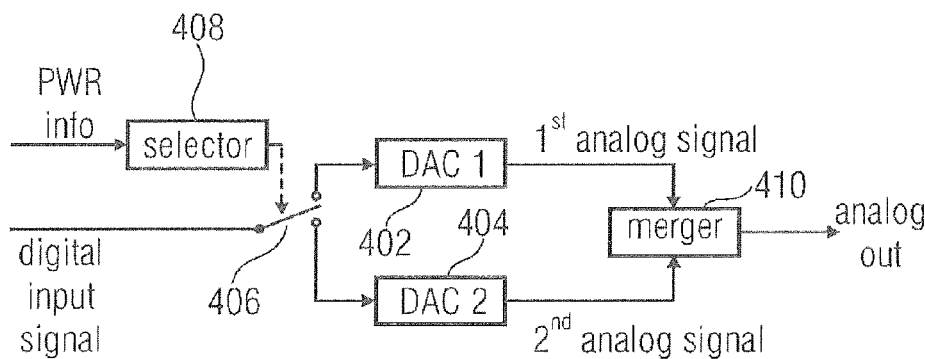
FIG. 4 shows a schematic block diagram of a digital-to-analog conversion arrangement and additional explanatory illustrations according to an embodiment of the teachings disclosed herein.
Figure 4:
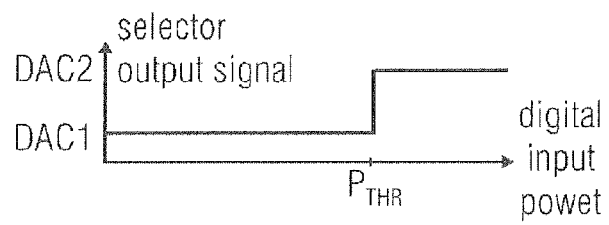
Figure 4:
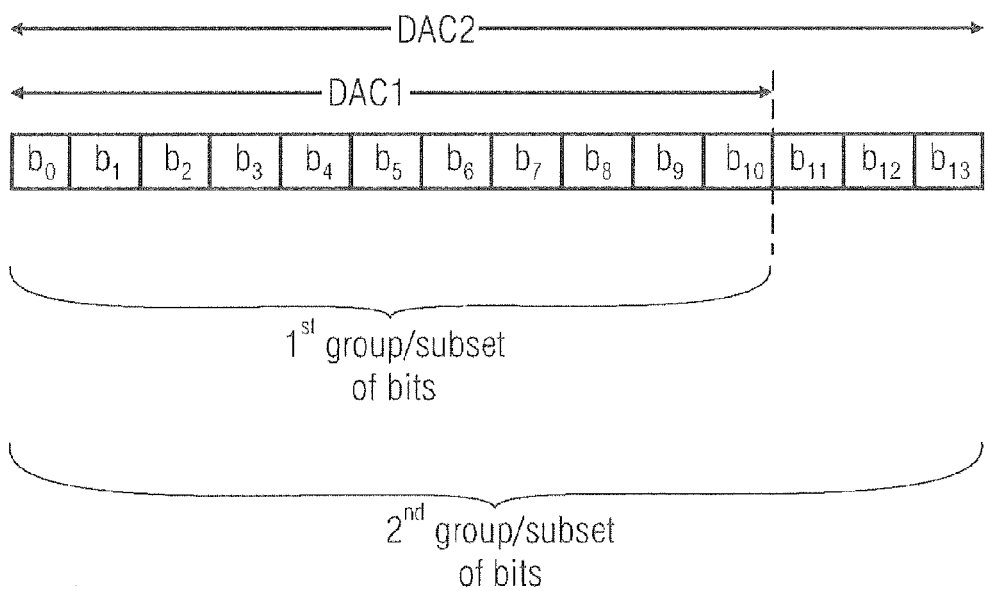

FIG. 4 shows a schematic block diagram of a digital-to-analog conversion arrangement according to a first embodiment of the teachings disclosed herein. The digital-to-analog conversion arrangement comprises a first digital-to-analog converter 402 and a second digital-to-analog converter 404. A digital input signal is distributed either to the first DAC or the second DAC depending on a position of a switch element 406. The switch element 406 is controlled by selector 408 which receives a power information about the power of the digital input signal at an input and generates a switch control signal for the switch element 406. Thus, either the first DAC 402 or the second DAC 404 proceeds to converting the digital input signal to a first analog signal or a second analog signal, respectively. Both, the first analog signal and the second signal are fed to an analog signal merger 410 which provides an analog output signal of the digital-to-analog conversion unit. According to one possible implementation, the analog signal merger 410 could be another switching element similar to the switching element 406 and also controlled by the control signal generated by the digital-to-analog converter selector 408. In other possible implementations, the analog signal merger 410 could comprise, for example, a transformer or simply a circuit node.

The first DAC 402 and the second DAC 404 differ with respect to their respective signal resolutions, that is the first DAC 402 is capable of converting a digital input signal having a higher number of bits (e.g. 14-bit) than the second DAC 404, or vice versa. Typically, the smaller signal resolution does not cover one or more of the more significant bits of the digital input signal. However, the signal representation according to the lower signal resolution is substantially equivalent to the representation using the higher signal resolution if the digital input signal currently takes an instantaneous value in which the more significant bits currently are not set. On the other hand, when the digital signal is in a digital input power range that requires setting the one or more of the more significant bits (at least for some of the values to be output), the digital input signal may not be correctly represented by the lower signal resolution. This drawback of the DAC having the lower signal resolution is made up for by the fact that the parasitic DAC capacitance is lower for this DAC, because the parasitic DAC capacitance increases with an increasing number of bits for higher signal resolution, typically.

FIG. 4 also contains a plot of a relation between the control signal of the digital-to-analog converter selector 408 and the digital input power (for example, the average power of a segment of a transmit signal, which segment of the transmit power comprises a plurality of samples of the digital input signal). According to this possible relation, the selector output signal controls the switching element 406 to connect the digital input signal with an input port of the first DAC 402 if the digital input power is lower than a power threshold $P_{THR}$. If the digital input power is higher than the power threshold $P_{THR}$, the selector output signal controls the switching element 406 to forward the digital input signal to the second DAC 404. As shown in the plot of FIG. 4, the selector 408 and the switch element 406 perform an abrupt switchover from the first DAC 402 to the second DAC 404, or vice versa, in case the digital input power crosses the power threshold $P_{THR}$. Such an abrupt switchover may be acceptable if the first DAC 402 and the second DAC 404 are substantially matched to each other, i.e. they produce practically the same analog value for a given digital input value, at least in the low power range. In practice, the first DAC 402 and the second DAC 404 may not be ideally matched to each other which may cause distortions and out-of-band emissions in the spectrum when abruptly switching from the first DAC 402 to the second DAC 404, or vice versa. Accordingly, the abrupt switchover may be replaced by a smooth switchover, like, for example, a crossfade as discussed below.

In the lower part of FIG. 4 the bits of the digital input signal are represented. The 14-bits are numbered as $b_0$ (least significant bit LSB) to $b_{13}$ (most significant bit MSB). The bits $b_0$ to $b_{13}$ are divided into two (overlapping) groups or subsets, the first group or subset comprising the eleven lower significant bits $b_0$ to $b_{10}$. The second group or subset of bits comprises all the bits $b_0$ to $b_{13}$. The first signal resolution of the first digital-to-analog converter 402 covers the first subset of bits $b_0$ to $b_{10}$. The second signal resolution of the second digital-to-analog converter 404 covers the second group of bits, i.e. the bits from $b_0$ to $b_{13}$.

According to the teachings disclosed herein, the output power range is divided in N sub-ranges, with N being 2, 3, 4, ... In each sub-range a specific scaled DAC (or RF-DAC) is used, which is optimally sized for IM3 and LO-leakage performance within the sub-range. If the digital-to-analog conversion arrangement comprises mixers, as will be presented below, the output power scaled RF-DACs are connected at the mixer output(s). Otherwise, the output of the DACs are connected, for example by means of the analog signal merger 410 shown in FIG. 4. For example, a transformer or a simple circuit node could be employed as the analog signal merger to merge the first analog signal and the second analog. However, more elaborate circuit arrangements may also be used as the signal merger. Another aspect, which will be explained in further detail below, is relative to ramping up and/or down the digital input signals for the DACs. If, in a transmission slot, the output power level changes between two sub-ranges, the currently used DAC may be ramped down, while the new DAC may be ramped up.

Figure 5:
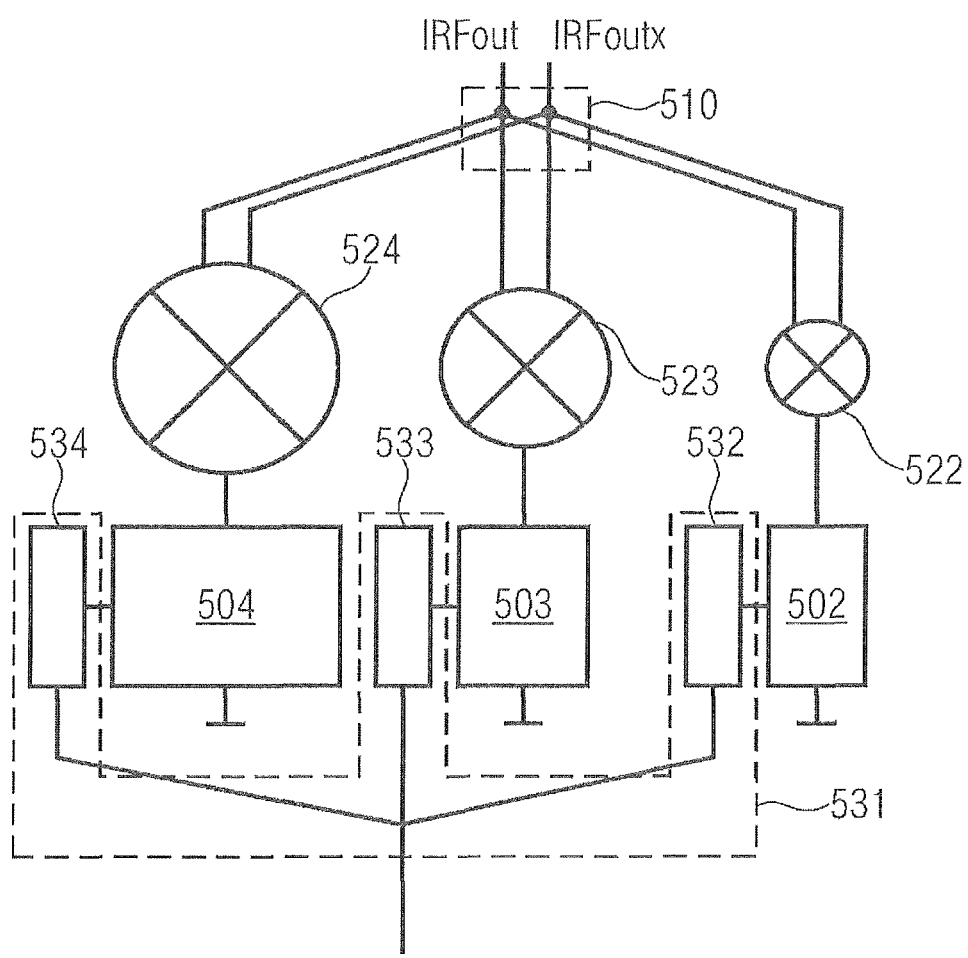
FIG. 5 shows a schematic block diagram of a digital-to-analog conversion and mixing arrangement according to another embodiment of the teachings disclosed herein.

The power information provided to the selector 408 may anticipate an upcoming power evolution of the digital input signal (for example, describe the power of a subsequent segment of the transmit signal). The power information may be generated by an entity that is, for example, upstream of the digital-to-analog conversion arrangement or at a higher hierarchy level. With an anticipated power evolution of the digital input signal, an upcoming transition from a first power range to a second power range can be gradually prepared so that immediately or shortly after the transition a digital-to-analog converter intended for the new power range provides the digital-to-analog conversion. In other words, the power information may be used to achieve a smooth transition between a provision of a signal by a first one of the DACs and a second one of the DACs. FIG. 5 shows a possible topology of a digital-to-analog conversion arrangement for the case N=3. The digital-to-analog conversion arrangement comprises three mixers 522, 523, 524. It also comprises three digital-to-analog converters 502, 503, 504. The outputs of the DACs 502, 503, 504 are connected to inputs of a corresponding one of the mixers 522, 523, 524, respectively. In general, the digital-to-analog conversion arrangement may comprise a first mixer 522 for mixing the first analog output signal of the first digital-to-analog converter 502 with a local oscillator signal, the first mixer 522 being connected to an output of the first digital-to-analog converter 502 and to a first input of the analog signal merger 510. The second mixer 524 for mixing the second analog output signal of the second digital-to-analog converter 504 with a local oscillator signal may be connected to an output of the second digital-to-analog converter 504 and to a second input of the analog signal merger 510. The first mixer 522 may be designed for a first analog power range corresponding to the first power range of the digital input signal and the second mixer 524 may be designed for a second analog power range corresponding to the second power range of the digital input signal. Of course, an extension to three or more DAC-mixer combinations is possible and within the scope of the teachings disclosed herein.

The mixers 522, 523, 524 comprise radio frequency (RF) outputs which are current-mode and are connected together. The resulting RF signal is the sum of the (differential) currents of the three mixers. The two connection points (for example, circuit nodes or other signal combiners) for the outputs of the three mixers 522, 523, 524 form the analog signal merger 510. An RF-DAC for a high power range comprises the DAC 504 and the mixer 524. An RF-DAC for a medium power range comprises the DAC 503 and the mixer 523. For a low power range, a corresponding RF-DAC comprises the DAC 502 and the mixer 522. As indicated by the size of the box representing the DACs 502, 503, 504 and of the circles representing the mixers 522, 523, 524, the DACs and the mixers are sized differently in order to match their assigned power range. In particular, the DAC 504 for the high power range may provide the full signal resolution for the digital input signal, while the medium power range and low power range DACs 503 and 502 may have reduced signal resolutions. The different sizes of the mixers 522, 523, 524 may be achieved by scaling the structural dimensions of a mixer in accordance with the intended power range, or by providing different numbers of basic mixer units in dependence of the intended the power range of the resulting mixer.

In the embodiments shown in FIG. 5, three ramping generators 532, 533, 534 are provided between an input interface for the digital input signal and the input of the DACs 502, 503, 504. The three ramping generators 532, 533, 534 form a ramp generation arrangement 531. The ramping generators 532, 533, 534 may evaluate the power information, or may alternatively evaluate the digital input signal, to determine whether a power of the digital input signal is in a corresponding power range of the DAC and the mixer to which the ramping generator is connected. Furthermore, the ramping generators may detect transitions of the power of the digital input signal into the corresponding power range or out of the corresponding power range. On the basis of this information, the ramping generators 532, 533, 534 may decide whether the digital input signal should be entirely forwarded to one of the DACs 502, 503, or 504, or whether the digital input signal should be split up (distributed) to a plurality of DACs. In the embodiment shown in FIG. 5, the digital-to-analog converter selector is distributed among the ramping generators 532, 533, 534. Typically, the actions of the ramping generators 532, 533, 534 are synchronized to each other so that the digital input signal is correctly converted to a corresponding analog output signal, even if several of the DACs 502, 503, 504 are concurrently converting the digital input signal so that the analog output signal is formed as the sum of the (differential) currents of the two or three mixers. The analog output signal can be obtained at the output labeled "IRFout/IRFoutx".

As an alternative to the embodiment shown in FIG. 5, a digital-to-analog converter selector 408 as used in the embodiment according to FIG. 4 may comprise at least one ramp generator for generating at least one ramped digital input signal for at least two of the first digital-to-analog converter 402, 502 and the second digital-to-analog converter 404, 504 (the same holds for the DAC 503). The digital-to-analog conversion arrangement may further comprise a transition detector for detecting, on the basis of the power information or on the basis of the digital input signal itself, a transition of the digital input signal from the first power range to the second power range (or to/from a further power range) or vice versa and for controlling the at least one ramp generator to fade the at least one ramped digital input signal.

The ramp generator 532, 533, 534 may be configured to output a first ramped digital input signal for the first digital-to-analog converter 402, 502 and a second ramped digital input signal for the second digital-to-analog converter 404, 504 (as above, an extension to three or more DACs is of course possible). A gradual crossfading from a first DAC to a second DAC may lead to smoother transitions, thus reducing out-of-band emissions and/or potentially audible artifacts in a speech signal that may be transmitted using the transmitter according to the teachings disclosed herein. The ramp generator may be further configured to successively use an increasing number of bits of the digital input signal in the first ramped or crossfaded digital input signal and a decreasing number of bits of the digital input signal in the second ramped or crossfaded digital input signal, or vice versa, in dependence on a detection of the transition of the digital input signal. Gradually using more and more bits of the digital input signal upon detection of a transition into a corresponding power range may lead to a smooth transition, in particular if the DACs are not exactly aligned to each other with respect to their quantization levels.

Figure 6:
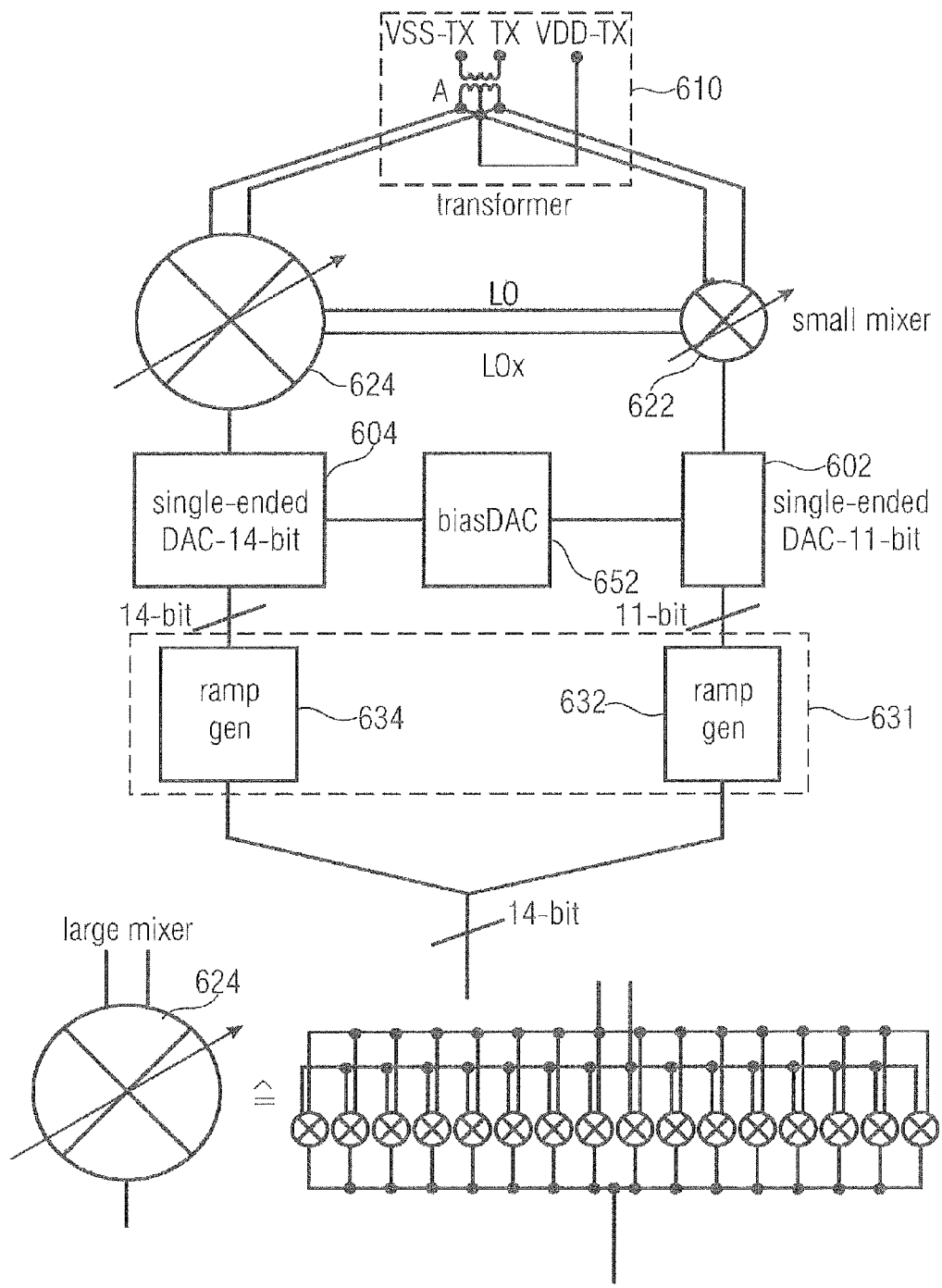
FIG. 6 shows a schematic block diagram of a digital-to-analog conversion and mixing arrangement according to a further embodiment of the teachings disclosed herein.

In FIG. 6 a possible implementation of power scaled RF-DACs for GSM/EDGE/UMTS is depicted as a schematic block diagram. In the implementation of FIG. 6 only two RF-DACs are used for the sake of clarity. A larger mixer 624 for high output power comprises 16 unit mixers, as illustrated in the lower part of FIG. 6. Each mixer unit can be switched on and off depending on the output power level. The large RF-DAC comprises the large mixer 624 and a 14-bit single-ended current steering DAC 604. The single-ended current steering DAC comprises a 10-bit thermometer coded DAC cell field and a 4-bit segmented part. The small RF-DAC comprises two unity mixers and a 11-bit single-ended DAC 602. The 11-bit single-ended DAC 602 is built of a 7-bit thermometer coded cell field and a 4-bit segmented part. A bias digital-to-analog converter 652 is used to compensate the power amplifier gain variations and other process dependent power losses for high output power-levels of −3 dBm up to 6 dBm. The unity mixers may have separate LO-drivers, which can be switched on or off, depending on the output power level. The 14-bit DAC 624 is driven by a 14-bit ramping generator 634. The 11-bit DAC is driven by an 11-bit ramping generator 632. The 14-bit ramping generator 634 and the 11-bit ramping generator form a ramp generation arrangement 631. In order to reduce the complexity, only two RF-DACs and ramping generators 632, 634 are used, thus ramping is required to change between only two output power ranges. In case of ramping, one DAC 602, 604 is ramped down, while the second DAC is simultaneously ramped up.

The analog signal merger 610 comprises in this implementation a transformer having a middle tap connected to an electrical potential designated by VDD-TX. At a secondary side of the transformer of the analog signal merger 610, a signal VSS-TX and a signal TX are provided.

As mentioned above, at least one of the first mixer 622 and the second mixer 624 comprises a plurality of mixer units. The first mixer 622 may comprise a first number of mixer units and the second mixer 624 may comprise a second number of mixer units different from the first number. The plurality of mixer units may comprise one or more switchable units configured to be switched on or off, independently from each other, in dependence on switch signals derived from a power level of the digital input signal. The digital-to-analog conversion arrangement may further comprise a mixer enabler for enabling and disabling at least one of the first mixer and the second mixer depending on whether the digital-to-analog converter selector 408 or equivalent has currently selected the first digital-to-analog converter 402, 502, 602 or the second digital-to-analog converter 404, 504, 604. The mixer enabler may be configured for turning on and/or turning off the local oscillator signal for at least one of the first mixer 522, 622 and the second mixer 524, 624. Moreover, the mixer enabler may be configured for turning on and/or turning off parts of the first mixer 522, 622 and of the second mixer 524, 624, such as the individual mixer units mentioned above. Turning off the local oscillator signal at least temporarily may improve a linearity of the digital-to-analog conversion arrangement and reduce its LO leakage.

Figure 7:
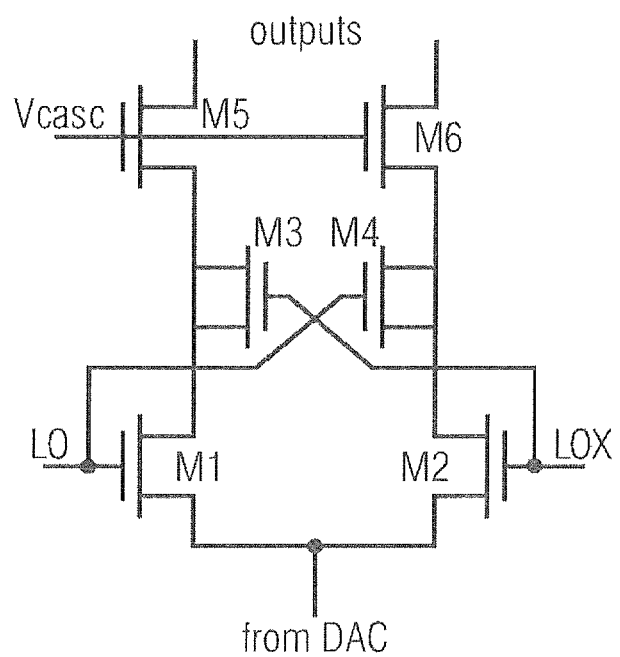
FIG. 7 shows a circuit schematic of a switchable unity mixer useable with a digital-to-analog conversion and mixing arrangement according to the teachings disclosed herein.

FIG. 7 shows a circuit implementation of a mixer unit useable within a mixer 522, 523, 524, 622, and 624. In case the mixer is disabled, the LO signal is turned off and both LO/LOx are grounded.

Two MOSFETs M1, M2 serve as actual mixing elements for mixing the analog signal output from the digital-to-analog conversion arrangement with a local oscillator signal LO and a phase-shifted local oscillator signal LOX. The MOSFETs M3, M4 compensate for a coupling-through of a gate-drain capacity of M1 and M2. To this end, the gates of the MOSFETs M3 and M4 are connected to the gates of the opposite MOSFET M2 and M1, respectively. Two further MOSFETS M5, M6 decouple a relatively low voltage at the mixing MOSFETS M1, M2 from a relatively high voltage at the output of the mixer circuit.

Figure 8:
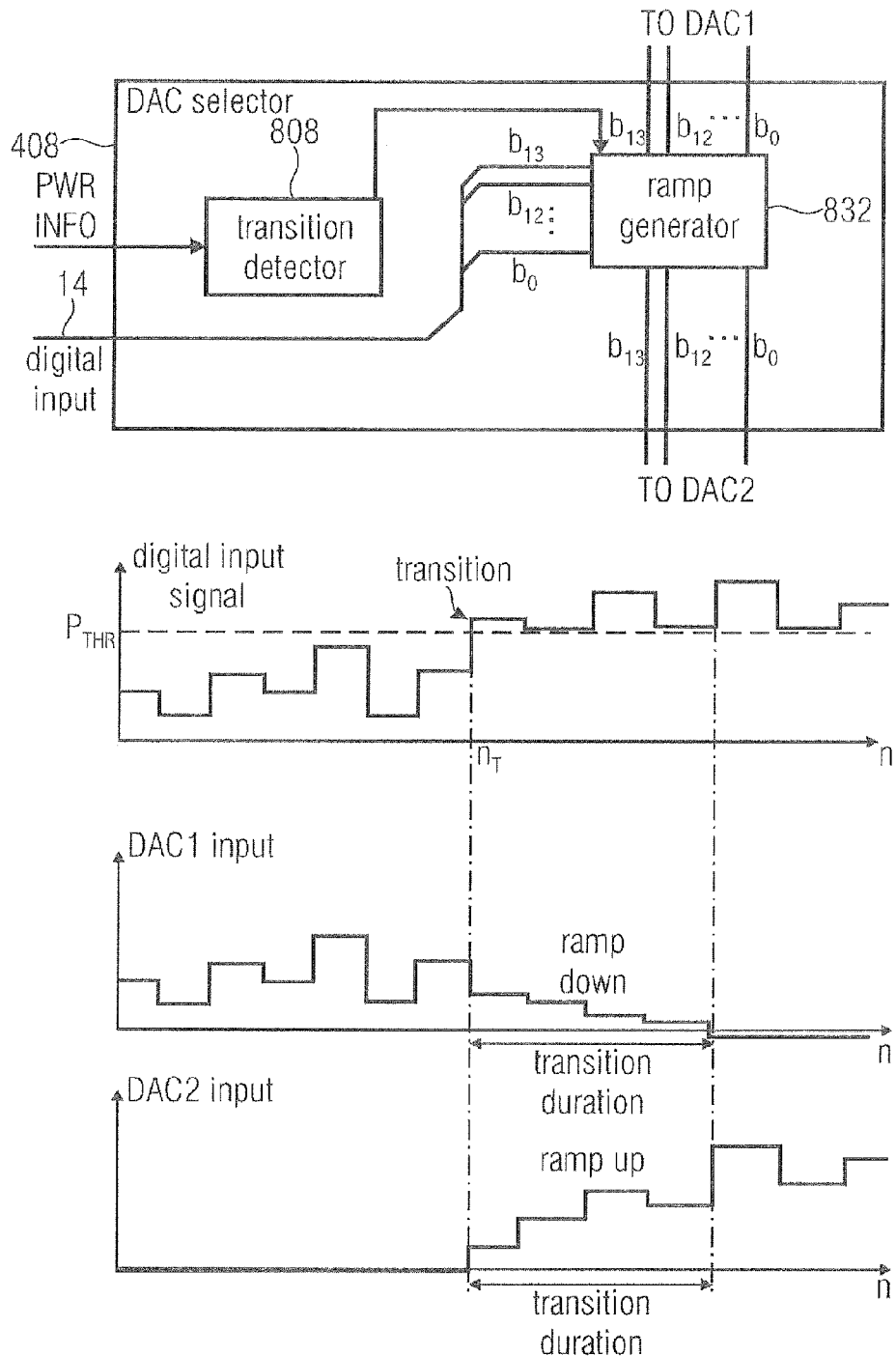
FIG. 8 shows a schematic block diagram of a digital-to-analog converter selector and illustrative signal evolutions over time according to an embodiment of the teachings disclosed herein.

FIG. 8 shows a schematic block diagram illustrating details of a possible implementation of the digital-to-analog converter selector 408 or equivalent modules. The digital-to-analog converter selector 408 receives the 14-bit digital input signal at an input port. The 14 individual bits of the digital input signal are connected to a ramp generator 832. The ramp generator 832 may be configured to convert the incoming digital input signal into two digital signals for the first DAC and the second DAC so that a sum of the two digital signals is equal to the digital input signal. Note that a bit pattern of the two digital signals may be substantially different from a bit pattern of the digital input signal. Nevertheless, the combination of the two digital input signals for the first DAC and the second DAC, respectively, still represent the same digital value. Alternatively, the ramp generator 832 may comprise an array of switching elements similar to the switching elements 406 in FIG. 4, but for the individual bits of the digital input signal. In this manner, the ramp generator 832 is capable of forwarding a first subset of the 14-bits of the digital input signal to the first DAC 402, 502, 602 and the remaining bits to the second DAC 404, 504, 604.

The DAC selector 408 also comprises a transition detector 808 which receives the power information. The transition detector 808 may be implemented as a state machine which is capable of determining whether the power information of the digital input signal has undergone a transition from a first power range to a second power range, or vice versa. In case a difference between a previous state and a current state is detected, this may indicate that a transition from a first power range to a second power range (or vice versa) has occurred. The transition detector 808 may then issue a corresponding control signal to the ramp generator 832 in order to initiate the crossfade between the first DAC 402, 502, 602 and the second DAC 404, 504, 604. Such crossfade may typically comprise a ramping up of the previously inactive DAC and a ramping down of the previously active DAC.

In the lower half of FIG. 8, possible waveforms of the digital input signal, the input DAC1 INPUT for the first DAC 402, and the input DAC2 INPUT for the second DAC 404 are shown. The digital input signal is initially in a lower power range beneath a power threshold $P_{THR}$ which is signaled by the power information PWR INFO. At an instant or a sampling interval $n_T$, a transition occurs within the digital input signal from the lower power range to the higher power range which is signaled by the power information PWR INFO. This transition is detected by the transition detector 808 which causes the ramp generator 832 to perform a ramping down of the input signal for the first DAC 402 and a ramping up of the input signal for the second DAC 404. As can be seen in the corresponding waveforms, the DAC1 input signal is gradually ramped down between the transition instant and an end of a transition duration (here four sampling intervals). During the transition duration, the sum of the DAC1 input signal and of the DAC2 input signal is (at least approximately) equal to the digital input signal. Before the transition duration, the DAC1 input signal is equal to the digital input signal and after the transition duration the DAC1 input signal is zero. In contrast, the input signal for the second DAC 404 is initially zero and then gradually ramped up during the transition duration to be equal to the digital input signal after the transition duration.

A counter or a timer may be used to control the transition during the transition duration. The counter may for example count the time slots during the transition duration in order to control the ramp generation so that a gradual transition during the transition duration can be achieved. In this case, the transition duration is defined by a number of time slots. The timer may be used if the transition duration is defined as a time span expressed in, for example, microseconds.

Figure 9:
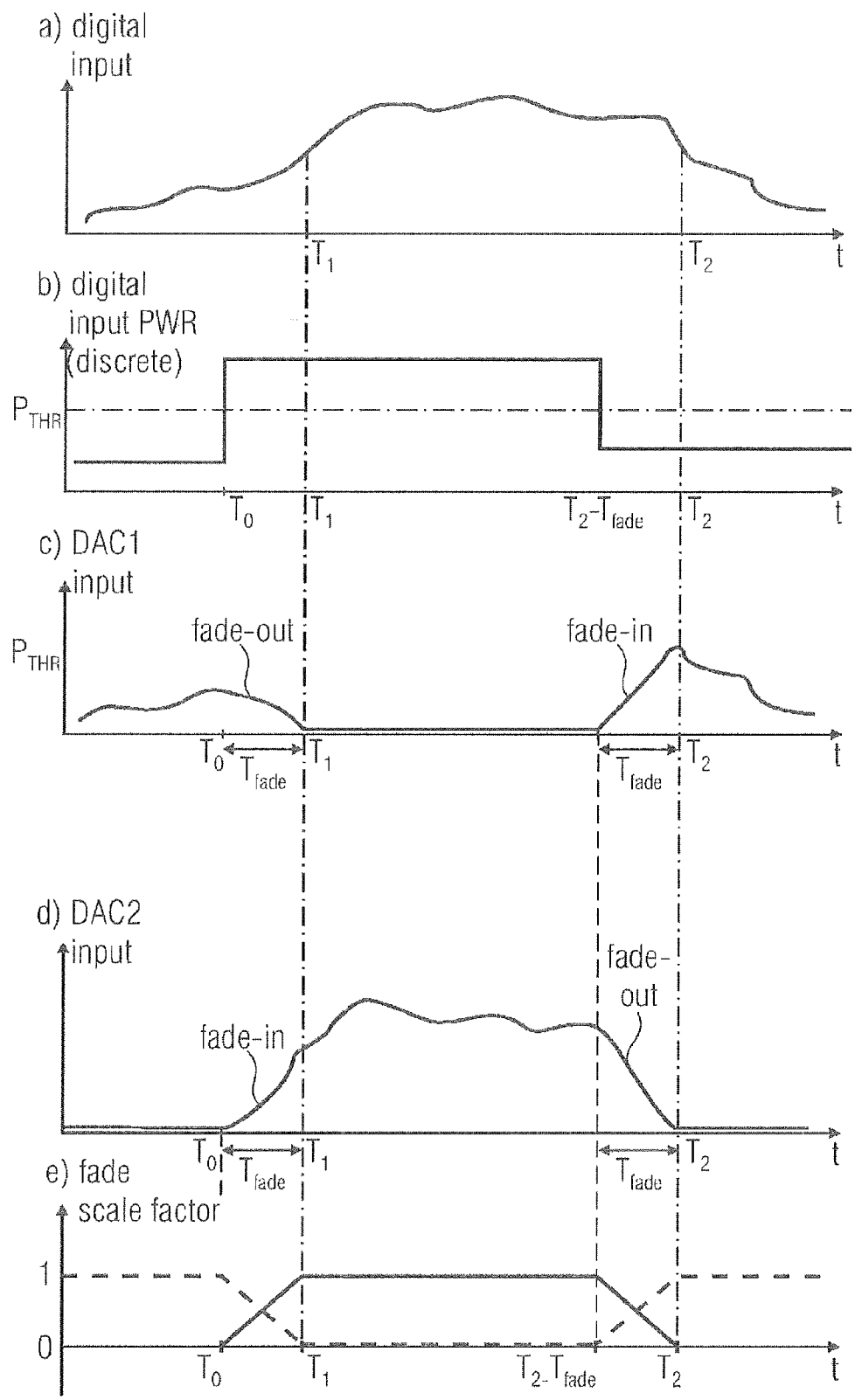
FIG. 9 shows a possible signal ramp between the digital input signals for a first digital-to-analog converter and a second digital-to-analog converter during a transition phase of the digital-to-analog conversion arrangement.

FIG. 9 illustrates a possible implementation of a transition using a ramping up/ramping down of the input signal for two different DACs. In a time diagram a) of FIG. 9, a possible temporal evolution of the digital input signal is illustrated as a time-continuous and value-continuous signal. During a first time interval the digital input signal exhibits relatively small amplitudes and hence the power of the digital input signal is relatively low, too. During a second time interval starting at $T_1$ the digital input signal exhibits higher amplitudes so that the power of the digital input signal is relatively high, as well. During a third illustrated time interval the digital input signal has relatively low amplitudes again. Accordingly, the power of the digital input signal is relatively low in the third time interval.

The plot b) in FIG. 9 shows a power range signal corresponding to the digital input signal in diagram a). In other words, the power range signal represents the power information about the digital input signal. The power range signal is illustrated in time-discrete and value-discrete representation. In particular, the power range signal has two states, a first state for a first power range of the digital input signal and a second state for a second power range of the digital input signal. Each of the two states is represented by a discrete value of the power range signal. Depending on whether the digital input power is above or beneath the threshold $P_{THR}$, the power range signal assumes one of two discrete values. By comparing plots a) and b) of FIG. 9 it can be seen that the power range signal of plot b) anticipates a future power evolution of the digital input signal shown in plot a) by a time span $T_{fade}$. The power information may be provided by an entity that is upstream or hierarchically superior to the digital-to-analog conversion arrangement so that said entity may be able to provide data about the future power evolution of the digital input signal.

Two further diagrams c) and d) of FIG. 9 illustrate an input signal for a first DAC and an input signal for a second DAC. The first DAC is typically selected for low digital input power. The second DAC is typically selected for high digital input power. As the digital input power is beneath the threshold $P_{THR}$ during the first time interval (e.g. before time $T_0$), the first DAC is selected and receives the digital input signal. At the same time, the input signal for the second DAC is zero. At a time instant $T_1$ the digital input power crosses the threshold $P_{THR}$. A ramping action is initiated at $T_0$ prior to the time instant $T_1$ for a time interval $T_{fade}$. This anticipation is possibly if the upcoming evolution of the digital input power is known in advance for a time interval $\geq T_{fade}$. The early signaling of an increase or a reduction of the power of the digital input signal may be provided by the power information, as mentioned above. During the fading action, the input signal for the first DAC gradually decreases to reach zero at the time instant $T_1$ (fade-out). At the same time, the input signal for the second DAC gradually increases to reach the instantaneous value of the digital input signal at the time instant $T_1$ (fade-in).

Assuming that the digital input power crosses the threshold $P_{THR}$ from high to low again at the time instant $T_2$, the inverse behavior can be observed: The input signal for the first DAC is ramped up in the time interval $[T_2-T_{fade}, T_2]$, while the input signal for the second DAC is ramped down.

The diagram e) in FIG. 9 illustrates two fade scale factors over time that are used to calculate the input signals for the first and second DACs. The fade scale factor for the first DAC is represented as a dashed line in FIG. 9e) and starts out with the value 1. Between $T_0=T_1-T_{fade}$ and $T_1$ the fade scale factor for the first DAC decreases linearly to zero. At the same time the fade scale factor for the second DAC drawn in full stroke increases from an initial value of zero to the value of 1 in the time interval $[T_1-T_{fade}, T_1]$. During the time interval $[T_2-T_{fade}, T_2]$ the fade scale factor for the first DAC increases again from zero to 1 and the fade scale factor for the second DAC decreases from 1 to zero.

The relation between the digital input signal DAC1 INPUT for the digital-to-analog conversion arrangement, the digital signals DAC1 INPUT, DAC2 INPUT for the first and seconds DACs, and the first and second fade scale factors Fade_Scale_Factor_1, Fade_Scale_Factor_2 may be expressed using the following formulas:

DAC1INPUT=Fade_Scale_Factor_1DACINPUT

DAC2INPUT=Fade_Scale_Factor_2DACINPUT

Preferably, the following relationship holds:

DACINPUT=DAC1INPUT+DAC2INPUT

<=>Fade_Scale_Factor_1+Fade_Scale_Factor_2=1

Accordingly, the input signal DAC1INPUT for the first DAC is determined by multiplying the digital input signal DACINPUT with the instantaneous value of the Fade_Scale_Factor_1. The input signal DAC2INPUT for the second DAC is determined by multiplying the digital input signal DACINPUT with the instantaneous value of the Fade_Scale_ Factor_2. The sum of the input signal for the first DAC and the input signal for the second DAC is equal to the digital input signal so that the digital input signal is correctly digital-to-analog converted by the digital-to-analog conversion arrangement. An equivalent condition is that the sum of the two fade scale factors is 1.

The ramp generation arrangement may be configured to perform a relatively smooth ramping in case a transition is detected. A maximal rate of ramping may be 4 LSB per unit of time and/or smallest ramping step. Other maximal rates may be 2 LSB per unit of time, 3 LSB per unit of time, 5 LSB per unit of time, or 8 LSB per unit of time (or per sample). The rate of ramping may also be influenced by an anticipation time interval by which the temporal evolution of the digital input power is known in advance. A long anticipation time interval typically allows a smaller maximal rate of ramping and thus a smoother transition. The ramp generation arrangement may comprise a timer or a counter in order to control the ramp generation during a transition duration, as previously explained.

Figure 10:
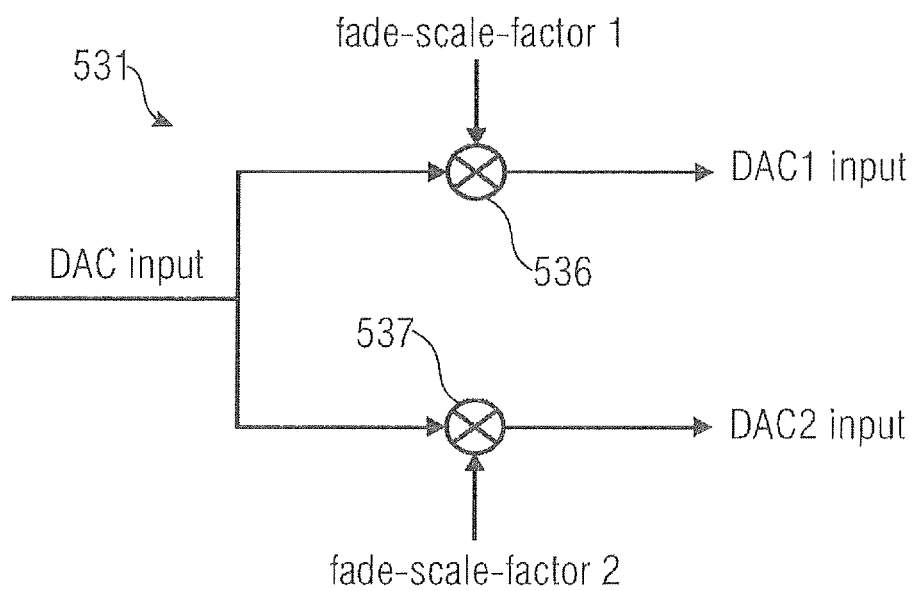
FIG. 10 shows a schematic block diagram of a crossfader for two DACs.

FIG. 10 shows a schematic block diagram of a ramp generation arrangement 531, 631. The ramp generation arrangement 531 comprises a first multiplier 536 and a second multiplier 537. The first multiplier 536 multiplies the digital input signal DACINPUT with the first fade scale factor "Fade_Scale_Factor_1" to provide the digital input signal DAC1 INPUT for the first DAC. The second multiplier 537 multiplies the digital input signal DACINPUT with the second fade scale factor "Fade_Scale_Factor_2" to provide the digital input signal DAC2 INPUT for the second DAC. For example, digital multipliers 536, 537 may be used. However, different concepts for ramp generation, which avoid the use of multipliers, may also be used.

Figure 11:
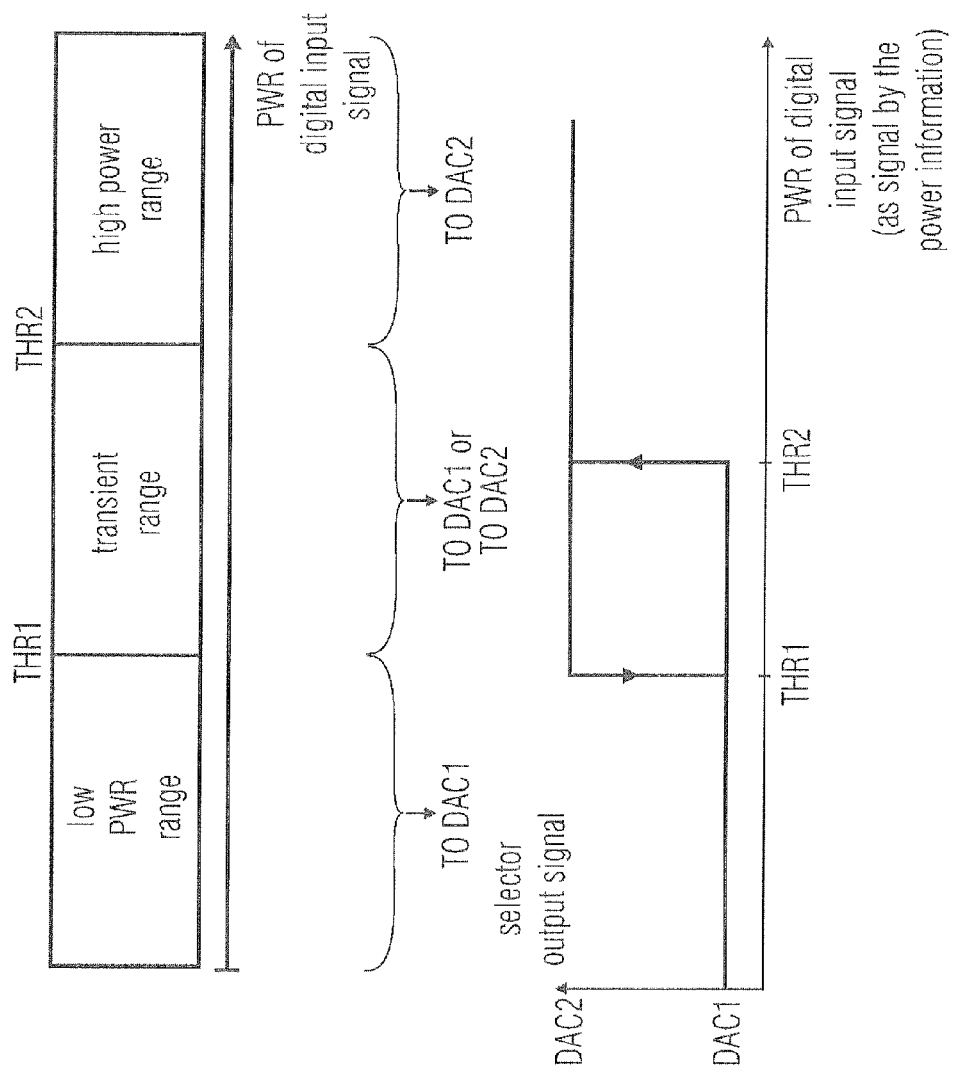
FIG. 11 illustrates various aspects in connection with power ranges and a selection of one of the power ranges.

FIG. 11 illustrates a possible assignment of different power ranges to the various DACs and a corresponding control signal output by an DAC selector. A first threshold THR1 separates a low power range from a transient power range. A second threshold THR2 separates the transient range from the higher power range.

The low power range is assigned to a first digital-to-analog converter and the high power range is assigned to a second digital-to-analog converter. The transient range is assigned to either the first DAC or the second DAC, depending on the history of the digital input signal.

The lower diagram in FIG. 11 shows how the selection of the first DAC and the second DAC may be implemented. The selection is a function of the power of the digital input signal (which is signaled, for example, by the power information) and comprises a hysteresis between the first threshold THR1 and the second threshold THR2. The provision of the transient range and the creation of the DAC selection signal using a hysteresis prevents that the selection of the digital-to-analog converters is modified too often. Thus, the selection of a particular DAC is more stable. In other words, a change of the currently active DAC to another DAC is performed when the previously active DAC is not well suited for the new power range of the digital input signal. However, no change of the currently active DAC to another DAC is performed when the currently active DAC is substantially just as well suited for the current power which typically is the transient range.

Figure 12:
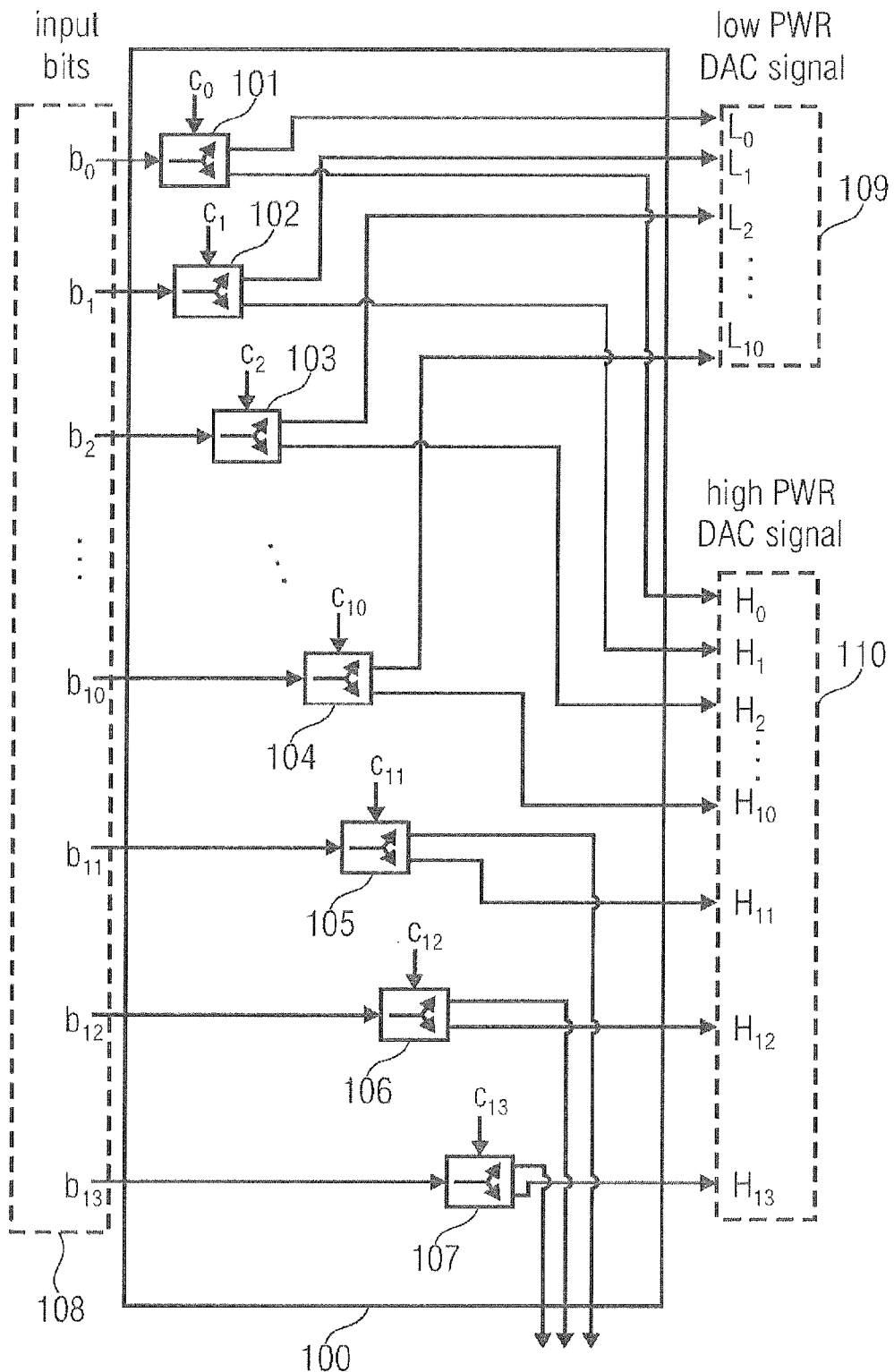
FIG. 12 shows a schematic block diagram of a bitwise controllable digital signal distributor.

FIG. 12 shows a schematic block diagram of a bitwise controllable digital signal distributor as it could be used within the ramp generator 832 of FIG. 8, for example. The input bits are provided to the bitwise controllable digital signal distributor 100 via an input interface 108. The input interface 108 has pins or equivalent/similar elements for the bits $b_0$ to $b_{13}$. The pins (or equivalent and/or similar elements) of the higher power interface 110 are designated as $H_0$ to $H_{13}$. Furthermore, a low power range output interface 109 having pins or equivalent/similar elements for bits designated by $L_0$ to $L_{10}$ is also connected to the bitwise controllable digital signal distributor 100.

The bitwise controllable digital signal distributor 100 comprises a plurality of switching elements 101 to 107 for the bits $b_0$ to $b_{13}$. Depending on corresponding control signals $c_0$ to $c_{13}$, the switching elements 101 to 107 distribute the corresponding bit either to the low power range interface 109 or the high power range interface 110. The control signals $c_0$ to $c_{13}$ may be provided by e.g. the transition detector 808 of the embodiment shown in FIG. 8. Other sources for the control signals $c_0$ to $c_{13}$ are also possible. Accordingly, a hard switching between the first DAC and the second DAC is avoided, and individual bits are switched between the first DAC and the second DAC. Even though this solution is not as smooth as the fading solution described with respect to FIGS. 8, 9, and 10, it may bring along sufficiently good results in some embodiments and may be superior to a hard switching between the digital-to-analog converters.

As already mentioned above, the bitwise controllable digital signal distributor 100 may completely redistribute the digital input signal by generating digital input signals for the various DACs. In such a configuration, the individual bits of the low power range interface 109 and of the high power range interface 110 may be individually generated (by choosing between high and low for each bit) on the basis of corresponding control signals $c_0$ to $c_{13}$. Such a configuration would allow even smoother transitions than the configuration shown in FIG. 12.

Figure 13:
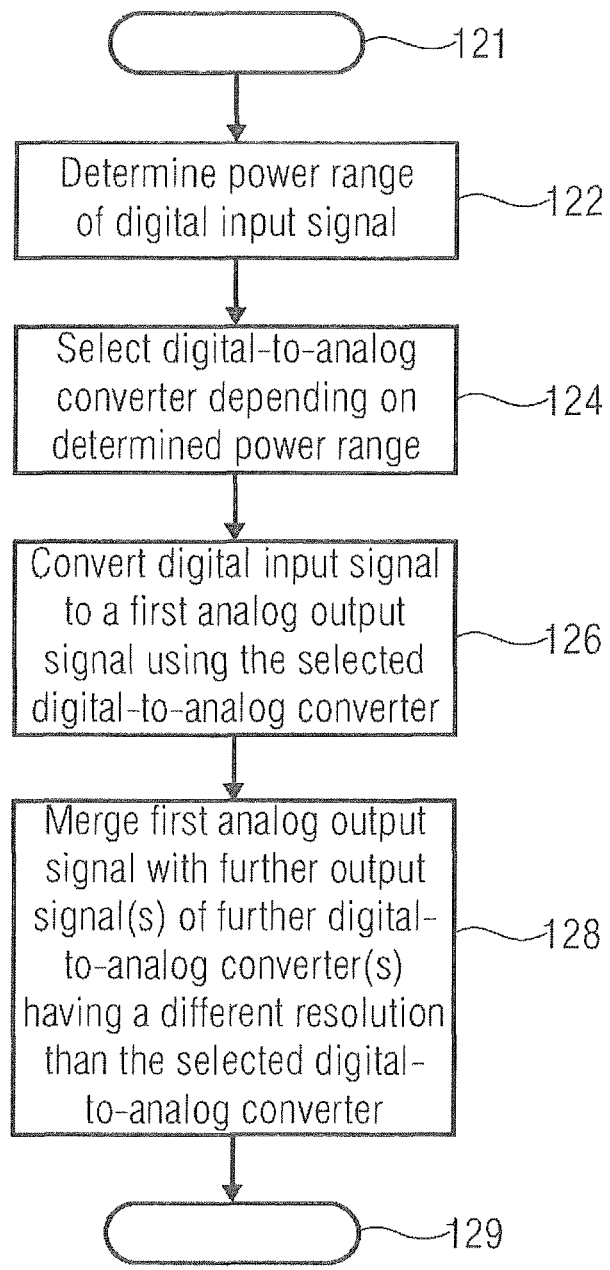
FIG. 13 shows a schematic flow diagram of a method for digital-to-analog conversion according to an embodiment of the teaching disclosed herein.

FIG. 13 shows a schematic flow diagram of a method for digital-to-analog conversion according to the teachings disclosed herein. After the start of the method at a starting point 121, a power range of a digital input signal to be converted to an analog output signal is determined at an action 122. In other words, it is determined in which of a plurality of power ranges the digital input signal currently is. Depending on the determined power range a digital-to-analog converter is selected at 124. The digital-to-analog converter is selected from a plurality of digital-to-analog converters in dependence on the determined power range.

The digital input signal is converted to a first analog output signal using the selected digital-to-analog converter, as represented by the box corresponding to an action 126 of the method for digital-to-analog conversion. The first analog output signal is then merged with one or more further output signal(s) of one or more further digital-to-analog converter(s). The one or more further digital-to-analog converter(s) typically have a different signal resolution than the selected digital-to-analog converter. The merging can be implemented as a time multiplexed selection of the various analog output signals of the digital-to-analog converters, or as a superposition of voltages and/or electric currents, or according to another scheme. Combinations are also possible, for example a time multiplexed selection of the analog output signals along with a current-mode superposition. The method then ends at a termination point 129.

According to further options, the method for digital-to-analog conversion may further comprise: detecting a transition of the digital input signal from a first power range to a second power range; generating a control signal for at least one ramp generator; and generating at least one ramp digital input signal for at least one of the plurality of digital-to-analog converters on the basis of, or in dependence on, the control signal.

The method may also comprise mixing at least one of the plurality of analog output signals with a local oscillator signal using a plurality of mixers designed for different analog power ranges corresponding to the plurality of power ranges of the digital input signal.

The teachings disclosed herein may also be applied to a computer readable digital storage medium having stored thereon a computer program having a program code for performing, when running on a computer, a method for digital-to-analog conversion of a digital input signal, the method comprising: determining in which of a plurality of power ranges the digital input signal currently is; selecting one digital-to-analog converter from a plurality of digital-to-analog converters in dependence on the determined power range; converting the digital input signal to a first analog output signal using the selected digital-to-analog converter; and merging the first analog output signal of the selected digital-to-analog converter with at least one further analog output signal of at least one further digital-to-analog converter of a plurality of digital-to-analog converters.

The computer may control a suitable circuitry, such as an application specific integrated circuit (ASIC) having a digital circuit portion and an analog circuit portion. For example, the digital circuit portion may perform the actions of determining the power range of the digital input signal and of selecting one of the digital-to-analog converters. The analog circuit portion may perform the merging of the first analog output signal and the at least one further output signal. For example, some types of microcontrollers comprise digital-to-analog converters.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A digital-to-analog conversion arrangement for converting a digital input signal, the digital-to-analog conversion arrangement comprising:
    a first digital-to-analog converter having a first signal resolution;
    a second digital-to-analog converter having a second signal resolution different from the first signal resolution; and
    a digital-to-analog converter selector configured to select the first digital-to-analog converter for digital-to-analog conversion of the digital input signal if the digital input signal has a power in a first power range, and to select the second digital-to-analog converter for digital-to-analog conversion of the digital input signal if the digital input signal has a power in a second power range;
    wherein the digital-to-analog conversion arrangement is configured to merge a first analog signal and a second analog signal, the first analog signal being based on a first analog output signal of the first digital-to-analog converter and the second analog signal being based on a second analog output signal of the second digital-to-analog converter.

2. The digital-to-analog conversion arrangement of claim 1, wherein the digital-to-analog converter selector comprises a power information input configured to receive a power information about the digital input signal.

3. The digital-to-analog conversion arrangement of claim 2, wherein the power information anticipates an upcoming power evolution of the digital input signal.

4. The digital-to-analog conversion arrangement of claim 1, wherein the digital-to-analog converter selector comprises at least one ramp generation arrangement configured to generate at least one ramped digital input signal for at least one of the first digital-to-analog converter or the second digital-to-analog converter, and
    a transition detector configured to detect a transition of the digital input signal from the first power range to the second power range or vice versa and configured to control the at least one ramp generation arrangement to generate the at least one ramped digital input signal.

5. The digital-to-analog conversion arrangement of claim 4, wherein the at least one ramp generation arrangement is configured to output a first ramped digital input signal for the first digital-to-analog converter and a second ramped digital input signal for the second digital-to-analog converter, depending on whether a transition of the digital input signal is detected.

6. The digital-to-analog conversion arrangement of claim 4, wherein the at least one ramp generation arrangement comprises a bitwise controllable digital signal distributor for distributing individual bits of the digital input signal to either the first digital-to-analog converter, the second digital-to-analog converter, or one or more further digital-to-analog converters.

7. The digital-to-analog conversion arrangement of claim 1, wherein the at least one ramp generation arrangement comprises at least one of a timer or a counter configured to control the generating of the at least one ramped digital input signal.

8. The digital-to-analog conversion arrangement of claim 1, further comprising:
    a first mixer configured to mix the first analog output signal of the first digital-to-analog converter with a local oscillator signal, the first mixer being connected to an output of the first digital-to-analog converter and to a first input of the analog signal merger;
    a second mixer configured to mix the second analog output signal of the second digital-to-analog converter with a local oscillator signal, the second mixer being connected to an output of the second digital-to-analog converter and to a second input of the analog signal merger;
    wherein the digital-to-analog conversion arrangement is configured to merge an output signal of the first mixer and an output signal of the second mixer;
    wherein the first mixer is designed for a first analog power range corresponding to the first power range of the digital input signal,
    and wherein the second mixer is designed for a second analog power range corresponding to the second power range of the digital input signal.

9. The digital-to-analog conversion arrangement of claim 8, wherein at least one of the first mixer or the second mixer comprises a plurality of mixer units.

10. The digital-to-analog conversion arrangement of claim 9, wherein the first mixer comprises a first number of mixer units and the second mixer comprises a second number of mixer units different from the first number.

11. The digital-to-analog conversion arrangement of claim 9, wherein the plurality of mixer units comprises one or more switchable mixer units configured to be switched on or off, independently from each other, depending on switch signals derived from a power level of the digital input signal.

12. The digital-to-analog conversion arrangement of claim 8, further comprising a mixer enabler configured to enable and disable at least one of the first mixer or the second mixer depending on whether the digital-to-analog converter selector has currently selected the first digital-to-analog converter or the second digital-to-analog converter.

13. The digital-to-analog conversion arrangement of claim 12, wherein the mixer enabler is configured to turn on or turn off the local oscillator signal for at least one of the first mixer or the second mixer.

14. The digital-to-analog conversion arrangement of claim 1, further comprising a bias digital-to-analog converter connected to the first digital-to-analog converter and the second digital-to-analog converter, the bias digital-to-analog converter configured to compensate for variations of a gain of an amplifier downstream of the digital-to-analog conversion arrangement.

15. The digital-to-analog conversion arrangement of claim 1, wherein the digital-to-analog conversion arrangement is configured to perform at least one of the following actions to merge the first analog signal and the second analog signal: multiplexing, combining two or more signals, or combining two or more currents.

16. The digital-to-analog conversion arrangement of claim 1, wherein at least one of the first digital-to-analog converter or the second digital-to-analog converter comprises a thermometer coded digital-to-analog converter cell field for a first bit portion of the digital input signal and a segmented part for a second bit portion of the digital input signal.

17. The digital-to-analog conversion arrangement of claim 1, wherein at least one of the first digital-to-analog converter or the second digital-to-analog converter comprises a first partial digital-to-analog converter implemented according to a first digital-to-analog conversion scheme and a second partial digital-to-analog converter according to a different second digital-to-analog conversion scheme.

18. The digital-to-analog conversion arrangement of claim 1, wherein at least one of the first signal resolution of the first digital-to-analog converter or the second signal resolution of the second digital-to-analog converter corresponds to a smaller number of bits than a digital input signal resolution of the digital input signal.

19. A digital-to-analog conversion arrangement for converting a digital input signal, the digital-to-analog conversion arrangement comprising:
   a first digital-to-analog converter configured to convert a first subset of bits of a digital input signal;
   a second digital-to-analog converter configured to convert a second subset of bits of the digital input signal, the second subset at least partially overlapping with the first subset;
   a power information provider configured to provide a digital input signal power of the digital input signal; and
   a comparator configured to compare the digital input signal power with a threshold and further configured to generate a comparison result with a value depending on whether the digital input signal is above or below the threshold;
   wherein the digital-to-analog conversion arrangement is configured to merge a first analog signal and a second analog signal, the first analog signal being based on a first analog output signal of the first digital-to-analog converter, and the second analog signal being based on a second analog output signal of the second digital-to-analog converter, and
   wherein the comparison result is configured to activate the first digital-to-analog converter if the digital input signal is below the threshold, and wherein the comparison result activates the second digital-to-analog converter if the digital input signal is above the threshold.

20. A digital-to-analog conversion arrangement for converting a digital input signal, the digital-to-analog conversion arrangement comprising:
   a first means for converting the digital input signal to an analog signal using a first subset of bits of the digital input signal;
   a second means for converting the digital input signal to an analog signal using a second subset of bits of the digital input signal;
   a means for selecting the first means for converting if the digital input signal has a power in a first power range, and for selecting the second means for converting if the digital input signal has a power in a second power range; and
   a means for merging a first analog signal and a second analog signal, the first analog signal being based on a first analog output signal of the first means for converting and the second analog signal being based on a second analog output signal of the second means for converting.

21. The digital-to-analog conversion arrangement of claim 20, wherein the means for selecting comprise
   at least one means for generating at least one ramped digital input signal for at least one of the first means for converting or the second means for converting, and
   a means for detecting a transition of the digital input signal from the first power range to the second power range or vice versa and for controlling the at least one means for generating the ramped digital input signal to fade-in the at least one digital input signal at the first digital-to-analog converter and to fade-out the at least one digital input signal at the second digital-to-analog converter, or vice versa.

22. The digital-to-analog conversion arrangement of claim 20, further comprising
   a first means for mixing the first analog output signal of the first means for converting with a local oscillator signal, the first means for mixing being connected to an output of the first means for converting and to a first input of the means for merging;
   a second means for mixing the second analog output signal of the second means for converting with a local oscillator signal, the second means for mixing being connected to an output of the second means for converting and to a second input of the means for merging;
   wherein the first means for mixing is designed for a first analog power range corresponding to the first power range of the digital input signal and the second means for mixing is designed for a second analog power range corresponding to the second power range of the digital input signal.

23. The digital-to-analog conversion arrangement of claim 22, wherein at least one of the first means for mixing or the second means for mixing comprises a plurality of mixer units.

24. The digital-to-analog conversion arrangement of claim 23, further comprising a means for enabling and disabling at least one of the first means for mixing or the second means for mixing depending on whether the means for selecting has currently selected the first means for converting or the second means for converting.

25. The digital-to-analog conversion arrangement of claim 24, wherein the means for enabling and disabling is configured to turn on and turn off the local oscillator signal for at least one of the first means for mixing or the second means for mixing.

26. A method for digital-to-analog conversion of a digital input signal, the method comprising:
   determining in which of a plurality of power ranges the digital input signal currently resides;
   selecting one digital-to-analog converter from a plurality of digital-to-analog converters depending on the determined power range;
   converting the digital input signal to a first analog output signal using the selected digital-to-analog converter; and
   merging a first analog signal with at least one further analog signal, the first analog signal being based on the first analog output signal of the selected digital-to-analog converter and the at least one further analog signal being based on at least one further analog output signal of at least one further digital-to-analog converter of the plurality of digital-to-analog converters.

27. The method for digital-to-analog conversion of claim 26, further comprising:
   detecting a transition of the digital input signal from a first power range to a second power range;

generating a control signal for at least one ramp generation arrangement in dependence on the detected transition of the digital input signal;

generating at least one ramped digital input signal for at least one of the plurality of digital-to-analog converters on the basis of the control signal.

28. The method for digital-to-analog conversion of claim 27, further comprising:

mixing at least one of the plurality of analog output signals with a local oscillator signal using a plurality of mixers designed for different analog power ranges corresponding to the plurality of power ranges of the digital input signal.

29. A computer readable digital storage non-transitory medium having stored thereon a computer program having a program code for performing, when running on a computer, a method for digital-to-analog conversion of a digital input signal, the method comprising:

determining in which of a plurality of power ranges the digital input signal currently resides;

selecting one digital-to-analog converter from a plurality of digital-to-analog converters depending on the determined power range;

converting the digital input signal to a first analog output signal using the selected digital-to-analog converter; and merging a first analog signal with at least one further analog signal, the first analog signal being based on the first analog output signal of the selected digital-to-analog converter and the at least one further analog signal being based on at least one further analog output signal of at least one further digital-to-analog converter of the plurality of digital-to-analog converters.

* * * * *